US 11,087,678 B2

(12) United States Patent
Park et al.

(10) Patent No.: US 11,087,678 B2
(45) Date of Patent: Aug. 10, 2021

(54) ORGANIC LIGHT-EMITTING DISPLAY

(71) Applicant: SAMSUNG DISPLAY CO., LTD., Yongin-si (KR)

(72) Inventors: Jinwoo Park, Yongin-si (KR);
Chaehan Hyun, Yongin-si (KR);
Kimyeong Eom, Yongin-si (KR);
Seungwoo Sung, Yongin-si (KR);
Junghoon Shim, Yongin-si (KR);
Minkyu Woo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/584,600

(22) Filed: May 2, 2017

(65) Prior Publication Data
US 2017/0323598 A1    Nov. 9, 2017

(30) Foreign Application Priority Data

May 3, 2016 (KR) .................. 10-2016-0054675

(51) Int. Cl.
*G09G 3/3233* (2016.01)
*H01L 51/50* (2006.01)
(Continued)

(52) U.S. Cl.
CPC ....... *G09G 3/3233* (2013.01); *H01L 27/3265* (2013.01); *H01L 27/3276* (2013.01); *H01L 51/50* (2013.01); *H01L 51/5203* (2013.01); *G09G 2300/0426* (2013.01); *G09G 2300/0819* (2013.01); *G09G 2300/0842* (2013.01); *G09G 2300/0861* (2013.01); *G09G 2300/0876* (2013.01); *G09G 2310/0262* (2013.01); *G09G 2320/02* (2013.01); *G09G 2320/043* (2013.01)

(58) Field of Classification Search
CPC ............. G09G 3/3233; G09G 2320/02; G09G 2300/0876
See application file for complete search history.

(56) References Cited

U.S. PATENT DOCUMENTS

| 8,717,259 B2 | 5/2014 | Park |
| 9,257,493 B2 | 2/2016 | Lee et al. |

(Continued)

FOREIGN PATENT DOCUMENTS

| KR | 10-2008-0001937 | 1/2008 |
| KR | 10-2008-0006891 A | 1/2008 |

(Continued)

*Primary Examiner* — Md Saiful A Siddiqui
(74) *Attorney, Agent, or Firm* — Kile Park Reed & Houtteman PLLC

(57) ABSTRACT

An organic light-emitting display includes a first pixel adjacent to a second pixel and a plurality of driving voltage lines to apply driving voltages to the first pixel and the second pixel. The driving voltage lines extend in a first direction crossing the first pixel and the second pixel and a second direction crossing the first direction. Each of the first and second pixels includes a first driving transistor and a second driving transistor that are symmetrical to each other with respect to a boundary between the first pixel and the second pixel, and a first compensation transistor and a second compensation transistor that are asymmetrical to each other with respect to the boundary.

19 Claims, 4 Drawing Sheets

(51) Int. Cl.
  *H01L 51/52* (2006.01)
  *H01L 27/32* (2006.01)

(56) References Cited

U.S. PATENT DOCUMENTS

| | | | |
|---|---|---|---|
| 9,373,670 B2 | 6/2016 | Tae | |
| 2006/0017393 A1* | 1/2006 | Kang | G09G 3/32 315/169.3 |
| 2007/0001938 A1* | 1/2007 | Lee | G09G 3/3225 345/76 |
| 2008/0001877 A1 | 1/2008 | Kim et al. | |
| 2009/0109148 A1* | 4/2009 | Tokuda | H01L 27/3265 345/76 |
| 2013/0201169 A1 | 8/2013 | Ahn | |
| 2014/0118232 A1* | 5/2014 | Kim | H01L 27/3262 345/82 |
| 2014/0132584 A1* | 5/2014 | Kim | H01L 21/76805 345/212 |
| 2014/0239270 A1* | 8/2014 | Ko | H01L 27/1255 257/40 |
| 2014/0292622 A1* | 10/2014 | Lee | G09G 3/3233 345/80 |
| 2014/0299843 A1* | 10/2014 | Kim | G09G 3/3225 257/40 |
| 2014/0320385 A1* | 10/2014 | Kwon | G09G 3/3233 345/82 |
| 2014/0353629 A1* | 12/2014 | Jin | H01L 27/3262 257/40 |
| 2015/0255523 A1* | 9/2015 | Her | G09G 3/3233 345/76 |
| 2016/0078809 A1* | 3/2016 | Yoon | H01L 27/124 345/78 |
| 2016/0275857 A1 | 9/2016 | Pyon et al. | |
| 2017/0309696 A1* | 10/2017 | Ebisuno | H01L 27/3276 |

FOREIGN PATENT DOCUMENTS

| | | |
|---|---|---|
| KR | 10-0819734 B1 | 3/2008 |
| KR | 10-2008-0050704 A | 6/2008 |
| KR | 10-2012-0075040 | 7/2012 |
| KR | 10-2013-0091499 | 8/2013 |
| KR | 10-2014-0077002 | 6/2014 |
| KR | 10-2014-0079093 A | 6/2014 |
| KR | 10-2014-0108023 | 9/2014 |
| KR | 10-2014-0140967 | 12/2014 |
| KR | 10-2015-0028628 | 3/2015 |
| KR | 10-2016-0113376 | 9/2016 |

* cited by examiner

ORGANIC LIGHT-EMITTING DISPLAY

CROSS-REFERENCE TO RELATED APPLICATION

Korean Patent Application No. 10-2016-0054675, filed on May 3, 2016, and entitled, "Organic Light-Emitting Display," is incorporated by reference herein in its entirety.

BACKGROUND

1. Field

One or more embodiments herein relate to an organic light-emitting display.

2. Description of the Related Art

A variety of displays have been developed. Examples include an organic light-emitting displays and a liquid crystal displays. Each of the pixels of these types of displays may include one or more thin film transistors (TFTs), a storage capacitor, an organic light-emitting diode, and wires.

The organic light-emitting diode includes an organic emission layer between a hole injection electrode and an electron injection electrode. In operation, excitons are generated when holes from the hole injection electrode and electrons from the electron injection electrode are injected into the organic emission layer. The diode emits light when the excitons change from an excited state to a ground state.

The organic light-emitting displays is a self-emission display apparatus which does not require a separate light source to form an image. As a result, organic light-emitting displays may operate with low voltage and have reduced weight and thickness. Also, organic light-emitting displays have a wide viewing angle, high contrast ratio, and fast response rate, and thus are often used in MP3 players, mobile phones, televisions, and other electronic devices.

SUMMARY

In accordance with one or more embodiments, an organic light-emitting display includes a first pixel adjacent to a second pixel; and a plurality of driving voltage lines to apply driving voltages to the first pixel and the second pixel, the driving voltage lines extending in a first direction crossing the first pixel and the second pixel and in a second direction crossing the first direction, wherein the first pixel includes a first driving transistor and a first compensation transistor and the second pixel includes a second driving transistor and a second compensation transistor and wherein: the first driving transistor and the second driving transistor are symmetrical to each other with respect to a boundary between the first pixel and the second pixel; and the first compensation transistor and the second compensation transistor are asymmetrical to each other with respect to the boundary.

The boundary may correspond to a middle portion of the first pixel and the second pixel. The driving voltage lines extending in the first direction planarly may overlap a first driving gate electrode of the first driving transistor and a second driving gate electrode of the second driving transistor. The driving voltage lines extending in the first direction may include a first upper electrode of a first storage capacitor of the first pixel, and a second upper electrode of a second storage capacitor of the second pixel.

The driving voltage line extending in the first direction is symmetrical to each other with respect to the boundary. Each of the first driving transistor and the second driving transistor includes a first driving active pattern and a second driving active pattern that are symmetrical to each other with respect to the boundary. The driving voltage lines extending in the first direction planarly may overlap a first driving drain area of the first driving active pattern and a second driving drain area of the second driving active pattern.

Each of the first compensation transistor and the second compensation transistor may include a first compensation active pattern and a second compensation active pattern that are asymmetrical to each other with respect to the boundary. Each of the first pixel and the second pixel may include a first connection wire and a second connection wire, the first connection wire may electrically connect the first driving transistor to the first compensation transistor, the second connection wire may electrically connect the second driving transistor to the second compensation transistor, and the first connection wire may be asymmetrical to the second connection wire with respect to the boundary.

The first connection wire may electrically connect a first driving gate electrode of the first driving transistor to a first compensation drain area of the first compensation transistor, and the second connection wire may electrically connect a second driving gate electrode of the second driving transistor to a second compensation drain area of the second compensation transistor. The first connection wire and the second connection wire may include a same material and are at a same level as the driving voltage lines. Each of the first connection wire and the second connection wire may include a metallic material. The first connection wire and the second connection wire may be curved in a same shape.

The display may include a first scanning line to provide scanning signals to the first compensation transistor and the second compensation transistor, wherein the first connection wire is at a same distance as the second connection wire with respect to the first scanning line. Each of the first pixel and the second pixel may include a first initialization transistor and a second initialization transistor that are asymmetrical to each other with respect to the boundary.

The display may include a plurality of scanning lines to provide scanning signals to the first initialization transistor and the second initialization transistor and extending in the first direction. The scanning lines may be symmetrical to each other with respect to the boundary. The first pixel may be a red or blue sub-pixel and the second pixel may be a green sub-pixel.

In accordance with one or more other embodiments, a display includes a first driving transistor in a first pixel; a first compensation transistor in the first pixel; a second driving transistor in a second pixel; and a second compensation transistor in the second pixel; wherein the first and second driving transistors are symmetrical to each other with respect to a boundary between the first and second pixels and wherein the first and second compensation transistors are asymmetrical to each other with respect to the boundary. The first pixel may be adjacent to the second pixel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
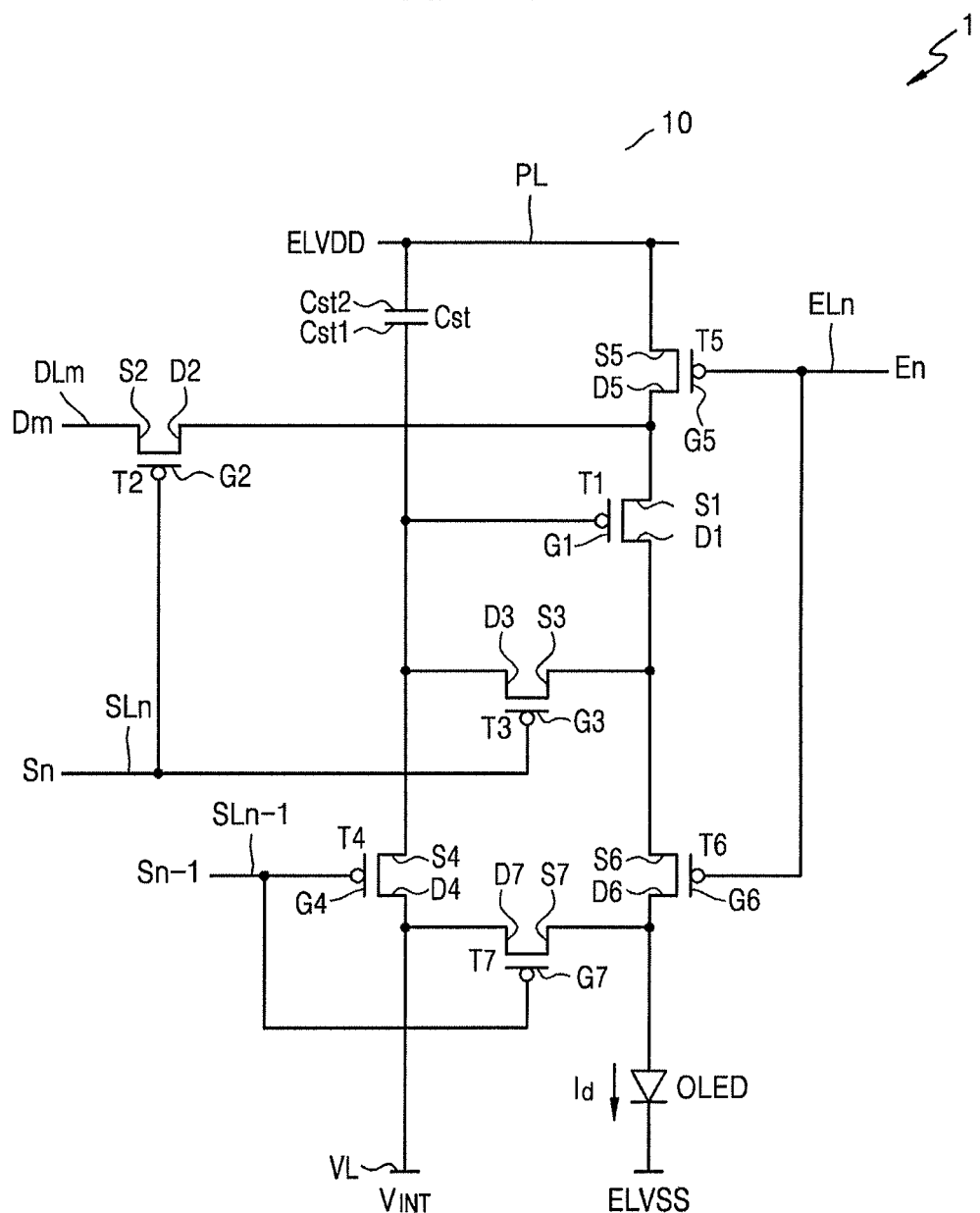
FIG. 1 illustrates an embodiment of a sub-pixel of an organic light-emitting display.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a sub-pixel of an organic light-emitting display 1. The organic light-emitting display 1 may include an organic light-emitting diode (OLED) on a TFT array substrate 10. The organic light-emitting display 1 may include pixels that emit light. Each pixel may include multiple sub-pixels. The TFT array substrate 10 may include lines to transmit electrical signals to drive each sub-pixel.

In one embodiment, the lines may include first and second scanning lines SLn and SLn−1 to transmit scanning signals Sn and Sn−1, data lines DLm to transmit data signals Dm, and driving voltage lines PL to apply a driving voltage ELVDD. As shown in FIG. 1, the lines may further include an initialization voltage line VL to apply an initialization voltage VINT and an emission control line ELn to transmit emission control signals En. The sub-pixels may be at locations where lines extending in a first direction cross lines extending in a second direction crossing the first direction.

The sub-pixel includes an OLED that emits light and a pixel circuit that drives the OLED based on signals from the lines. The pixel circuit may include at least two TFTs and at least one storage capacitor. In the embodiment of FIG. 1, the pixel circuit includes seven TFTs T1 to T7 and one storage capacitor Cst.

The TFTs may include a driving TFT T1, a data transmission TFT T2, a compensation TFT T3, a first initialization TFT T4, a first emission control TFT T5, a second emission control TFT T6, and a second initialization TFT T7.

The driving TFT T1 includes a gate electrode G1 connected to a lower electrode Cst1 of the storage capacitor Cst, a source electrode S1 connected to the driving voltage line PL via the first emission control TFT T5, and a drain electrode D1 electrically connected to a pixel electrode of the OLED via the second emission control TFT T6. The driving TFT T1 may provide a driving current Id to the OLED based on the data signal Dm according to a switching operation of the data transmission TFT T2.

The data transmission TFT T2 includes a gate electrode G2 connected to the first scanning line SLn, a source electrode S2 connected to the data line DLm, and a drain electrode D2 connected to the source electrode S1 of the driving TFT T1 and to the driving voltage line PL via the first emission control TFT T5. The data transmission TFT T2 is turned on based on the first scanning signal Sn from the first scanning line SLn and performs a switching operation of transmitting the data signal Dm from the data line DLm and to the source electrode S1 of the driving TFT T1.

The compensation TFT T3 includes a gate electrode G3 connected to the first scanning line SLn and a source electrode S3 connected to the drain electrode D1 of the driving TFT T1 and the pixel electrode of the OLED via the second emission control TFT T6. A drain electrode D3 of the compensation TFT T3 is connected to the lower electrode Cst1 of the storage capacitor Cst, a source electrode S4 of the first initialization TFT T4, and the gate electrode G1 of the driving TFT T1. The compensation TFT T3 is turned on based on the first scanning signal Sn transmitted from the first scanning line SLn and connects the gate electrode G1 of the driving TFT T1 to the drain electrode D1 thereof for diode-connection of the driving TFT T1.

The first initialization TFT T4 includes a gate electrode G4 connected to the second scanning line SLn−1 and a drain electrode D4 connected to the initialization voltage line VL. The source electrode S4 of the first initialization TFT T4 is connected to the lower electrode Cst1 of the storage capacitor Cst, the drain electrode D3 of the compensation TFT T3, and the gate electrode G1 of the driving TFT T1. The first initialization TFT T4 is turned on based on the second scanning signal Sn−1 from the second scanning line SLn−1, and performs an initialization operation of initializing the voltage of the gate electrode G1 of the driving TFT T1 by applying the initialization voltage $V_{INT}$ to the gate electrode G1 of the driving TFT T1.

The first emission control TFT T5 includes as gate electrode G5 connected to the emission control line ELn. A source electrode S5 of the first emission control TFT T5 is connected to the driving voltage line PL. A drain electrode D5 of the first emission control TFT T5 is connected to the source electrode S1 of the driving TFT T1 and the drain electrode D2 of the data transmission TFT T2. The first emission control TFT T5 is between the driving voltage line PL and the driving TFT T1. The first emission control TFT T5 is turned on based on the emission control signal En transmitted from the emission control line ELn and applies the driving voltage ELVDD to driving TFT T1.

The second emission control TFT T6 includes a gate electrode G6 connected to the emission control line ELn, a source electrode S6 connected to the drain electrode D1 of the driving TFT T1 and the source electrode S3 of the compensation TFT T3, and a drain electrode D6 electrically connected to the pixel electrode of the OLED. The first emission control TFT T5 and the second emission control TFT T6 are simultaneously turned on based on the emission control signal En transmitted from the emission control line ELn. The driving voltage ELVDD is applied to the OLED to allow driving current Id to flow in the OLED.

The second initialization TFT T7 includes a gate electrode G7 connected to the second scanning line SLn−1, a source electrode S7 connected to the pixel electrode of the OLED, and a drain electrode D7 connected to the initialization voltage line VL. The second initialization TFT T7 is turned on based on the second scanning signal Sn−1 from the second scanning line SLn−1 and thus initializes the pixel electrode of the OLED.

In the present embodiment, the first initialization TFT T4 and the second initialization TFT T7 are connected to the second scanning line SLn−1. In one embodiment, the first initialization TFT T4 may be connected to the second scanning line SLn−1 and operate based on second scanning signal Sn−1. The second initialization TFT T7 may be connected to a next scanning line and may operate according to a next scanning signal.

The storage capacitor Cst includes a upper electrode Cst2 connected to the driving voltage line PL. A common electrode of the OLED is connected to a common voltage ELVSS. Accordingly, the OLED emits light based on the driving current Id from the driving TFT T1 to display an image.

Figure 2:
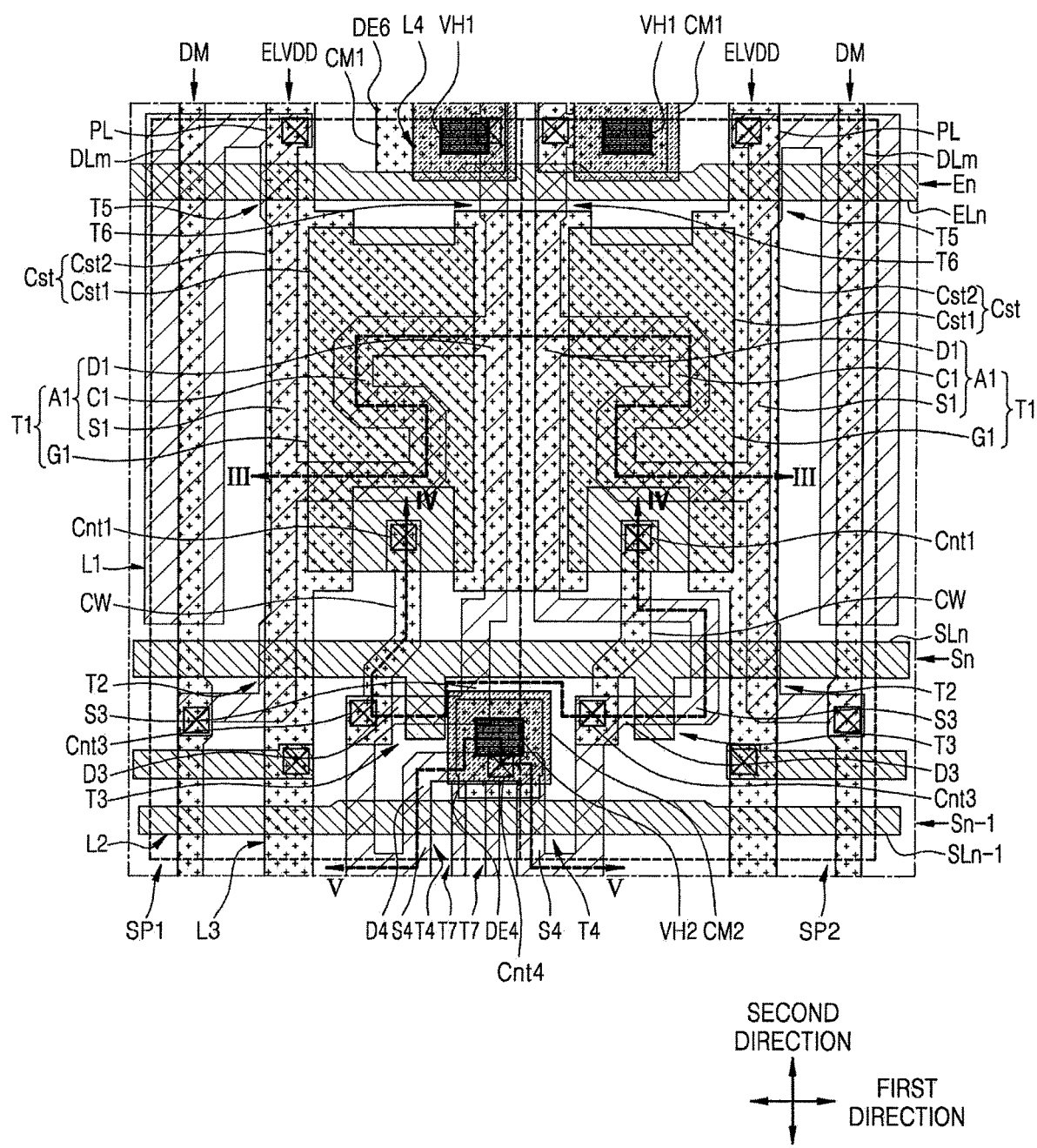
FIG. 2 illustrates an embodiment of sub-pixels of an organic light-emitting display.
Figure 3:
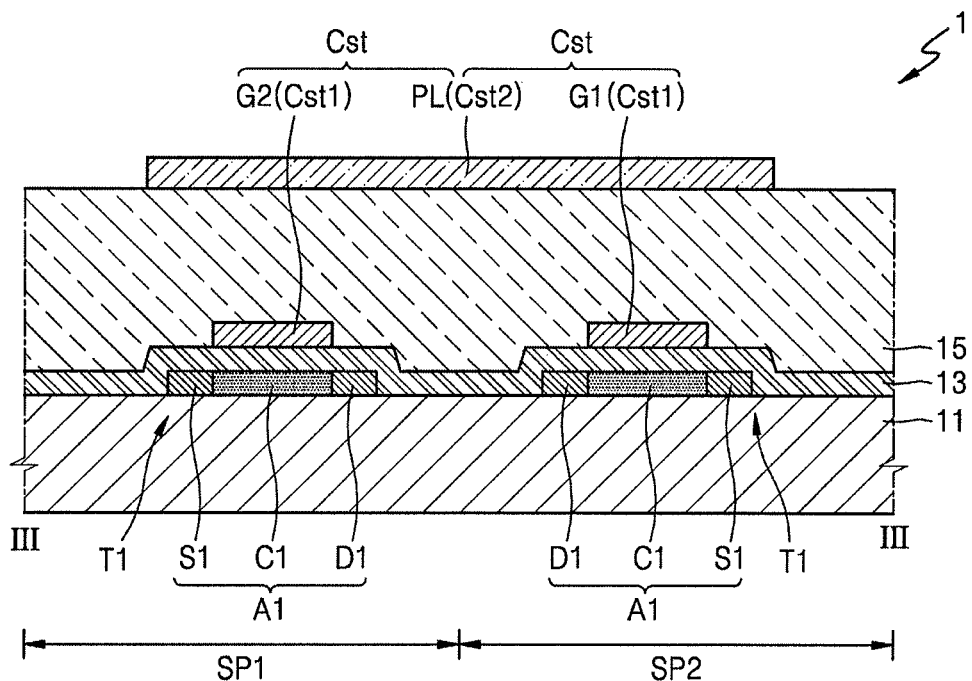
FIG. 3 illustrates a view taken along section line III-III in FIG. 2.
Figure 4:
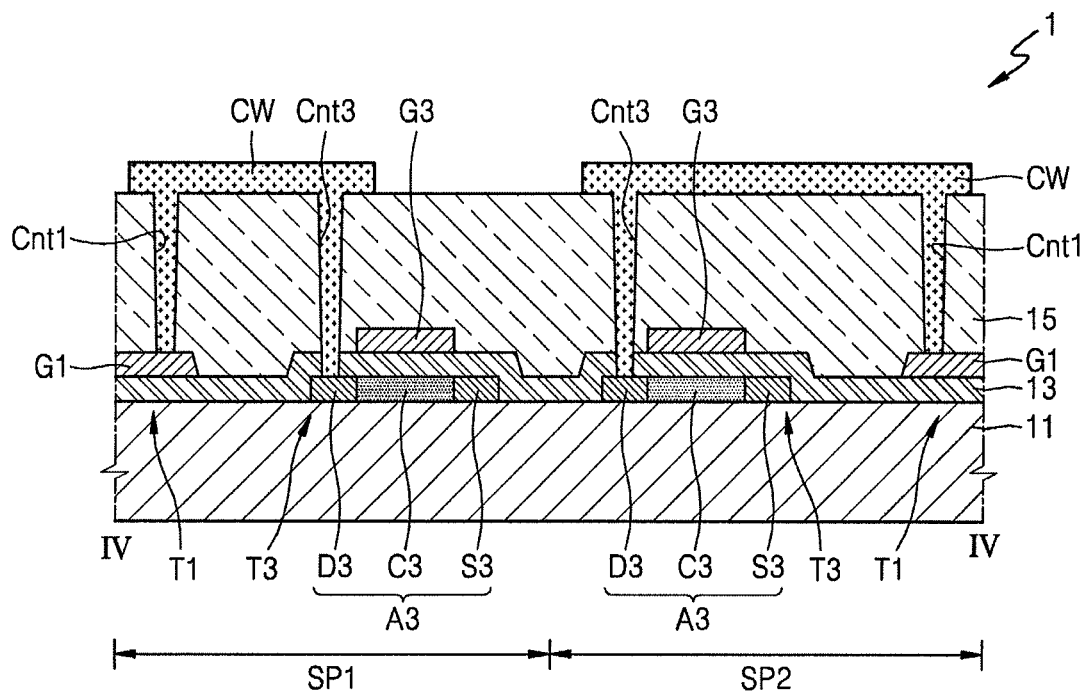
FIG. 4 illustrates a view taken along section line IV-IV in FIG. 2.
Figure 5:
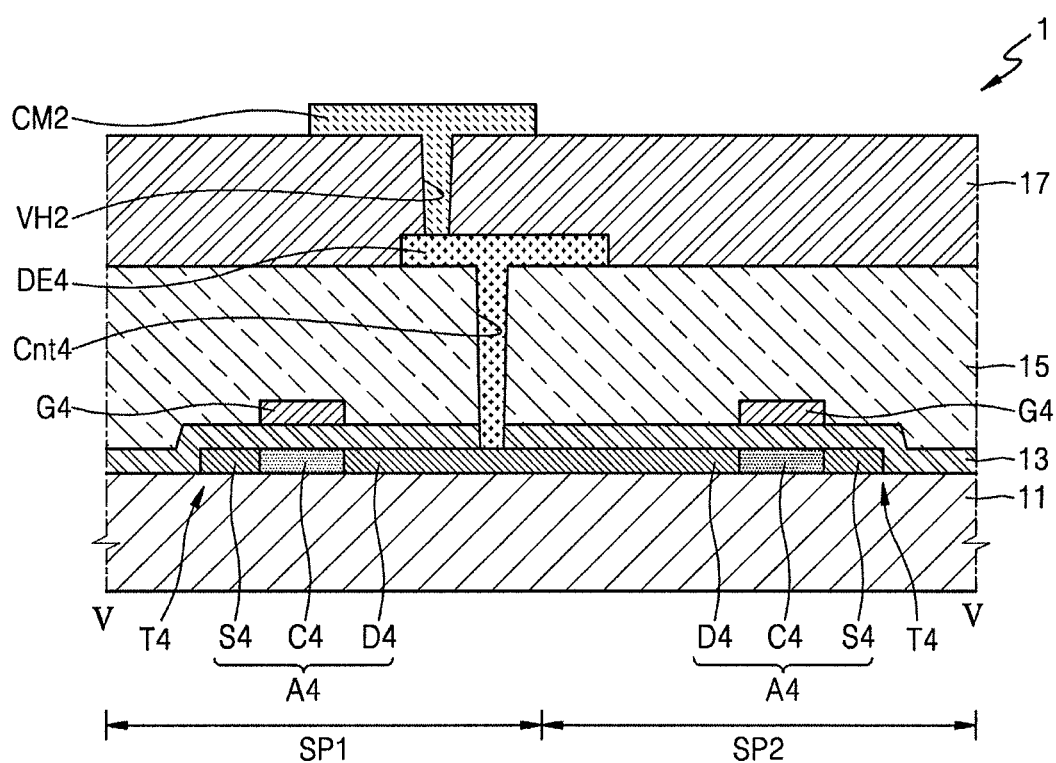
FIG. 5 illustrates a view taken along section line V-V in FIG. 2.

FIG. 2 illustrates a layout embodiment of two sub-pixels of the organic light-emitting display. FIG. 3 illustrates a view taken along section line III-III in FIG. 2. FIG. 4 illustrates a view taken along section line IV-IV in FIG. 2. FIG. 5 illustrates a view taken along section line V-V in FIG. 2.

Referring to FIGS. 2 to 5, the TFT array substrate 10 may include a first sup-pixel SP1 and a second sub-pixel SP2. The first sup-pixel SP1 and the second sub-pixel SP2 are adjacent sub-pixels. According to an embodiment, the first sup-pixel SP1 may be a red or blue sub-pixel and the second sub-pixel SP2 may be a green sub-pixel. For example, when the first sup-pixel SP1 in a first row is a red sub-pixel and the second sub-pixel SP2 in the first row is a green sub-pixel, the first sup-pixel SP1 in a second row may be a blue sub-pixel and the second sub-pixel SP2 in the second row may be a green sub-pixel.

FIG. 2 shows that the first sup-pixel SP1 and the second sub-pixel SP2 are rectangular. The first sup-pixel SP1 and second sub-pixel SP2 may have different shapes and/or different areas in another embodiment.

A semiconductor layer L1 has a curved shape on a base substrate 11 of the TFT array substrate 10. The base substrate 11 may include, for example, at least one of glass material, metal or plastic material such as polyethylen terephthalate (PET), polyethylen naphthalate (PEN), or polyimide. Semiconductor layer L1 may include a semiconductor material, e.g., polysilicon. A buffer layer may be between the base substrate 11 and the semiconductor layer L1 to prevent penetration of impurities and flatten a surface of the base substrate 11.

Each of the first sup-pixel SP1 and second sub-pixel SP2 may include a driving TFT T1. The driving TFT T1 may include an active pattern A1 that is an area of the semiconductor layer L1. The active pattern A1 of the driving TFT T1 may include a channel area C1 that is not doped with impurities and source and drain areas S1 and D1 that are doped with impurities and have conductivity. The channel area C1 may be curved in various ways. For example, the channel area C1 may have a zigzag shape or an S shape in order to be elongated as much as possible in a narrow space. As the length of the channel area C1 increases, the driving range of a gate voltage may increase.

In an embodiment, the driving TFT T1 of the first sup-pixel SP1 and the driving TFT T1 of the second sub-pixel SP2 are symmetrical to each other with respect to a boundary between the first sup-pixel SP1 and the second sub-pixel SP2. For example, the distance from the boundary between the first sup-pixel SP1 and the second sub-pixel SP2 to the drain area D1 of the driving TFT T1 of the first sup-pixel SP1 may be equal to the distance from the boundary between the first sup-pixel SP1 and the second sub-pixel SP2 to the drain area D1 of the driving TFT T1 of the second sub-pixel SP2. The boundary between the first sup-pixel SP1 and the second sub-pixel SP2 may correspond, for example, to a middle portion of the first sup-pixel SP1 and the second sub-pixel SP2.

The data transmission TFT T2 of the first sup-pixel SP1 and the data transmission TFT T2 of the second sub-pixel SP2 may be symmetrical to each other with respect to the boundary between the first sup-pixel SP1 and the second sub-pixel SP2.

The first emission control TFT T5 of the first sup-pixel SP1 and the first emission control TFT T5 of the second sub-pixel SP2 may be symmetrical to each other with respect to the boundary between the first sup-pixel SP1 and second sub-pixel SP2.

The second emission control TFT T6 of the first sup-pixel SP1 and the second emission control TFT T6 of the second sub-pixel SP2 may be symmetrical to each other with respect to the boundary between the first sup-pixel SP1 and second sub-pixel SP2.

Because the driving TFTs T1, etc., of adjacent sub-pixels are symmetrically arranged, the likelihood of the occurrence of a defect (e.g., disconnection or a short-circuit caused by a decrease in gaps between the lines) may decrease.

Each of the first sup-pixel SP1 and the second sub-pixel SP2 may include at least one compensation TFT T3. The compensation TFT T3 may include an active pattern A3 that is an area of the semiconductor layer L1. The active pattern A3 of the compensation TFT T3 may include a channel area C3 that is not doped with impurities and source and drain areas S3 and D3 doped with impurities and have conductivity.

In an embodiment, the compensation TFT T3 of the first sup-pixel SP1 and the compensation TFT T3 of the second sub-pixel SP2 are asymmetrical to each other with respect to the boundary between the first sup-pixel SP1 and second sub-pixel SP2. For example, the active pattern A3 of the compensation TFT T3 of the first sup-pixel SP1 and the active pattern A3 of the compensation TFT T3 of the second sub-pixel SP2 may be asymmetrical to each other with respect to the boundary between the first sup-pixel SP1 and second sub-pixel SP2. The distance from the boundary between the first sup-pixel SP1 and second sub-pixel SP2 to the drain area D3 of the compensation TFT T3 of the first sup-pixel SP1 may be different from the distance from the boundary between the first sup-pixel SP1 and second sub-pixel SP2 to the drain area D3 of the compensation TFT T3 of the second sub-pixel SP2.

Because the compensation TFTs T3 of adjacent sub-pixels are asymmetrically arranged, the likelihood of the occurrence of a disconnection or short-circuit is reduced. Also, color deviation of each of the adjacent sub-pixels caused by overlay deviation may be reduced.

Each of the first sup-pixel SP1 and the second sub-pixel SP2 may include at least one first initialization TFT T4. The first initialization TFT T4 may include an active pattern A4 that is an area of the semiconductor layer L1. The active pattern A4 of the first initialization TFT T4 may include a channel area C4 not doped with impurities and source and drain areas S4 and D4 that are doped with impurities and have conductivity.

Because the compensation TFTs T3 of the adjacent sub-pixels are asymmetrically arranged, the first initialization TFTs T4 of the adjacent sub-pixels that share a second via hole VH2 may also be asymmetrically arranged.

In an embodiment, the first initialization TFT T4 of the first sup-pixel SP1 and the first initialization TFT T4 of the second sub-pixel SP2 may be asymmetrical to each other with respect to the boundary between the first sup-pixel SP1 and the second sub-pixel SP2. For example, the active pattern A4 of the first initialization TFT T4 of the first sup-pixel SP1 and the active pattern A4 of the first initialization TFT T4 of the second sub-pixel SP2 may be asymmetrical to each other with respect to the boundary between the first sup-pixel SP1 and the second sub-pixel SP2. The distance from the boundary between the first sup-pixel SP1 and the second sub-pixel SP2 to the source area S4 of the first initialization TFT T4 of the first sup-pixel SP1 may be different from the distance from the boundary between the first sup-pixel SP1 and the second sub-pixel SP2 to the source area S4 of the first initialization TFT T4 of the second sub-pixel SP2.

The second initialization TFT T7 of the first sup-pixel SP1 and the second initialization TFT T7 of the second sub-pixel SP2 may be asymmetrical to each other with respect to the boundary between the first sup-pixel SP1 and second sub-pixel SP2.

A first insulating layer 13 may be on the base substrate 11 to cover the driving TFT T1. The first insulating layer 13 may be a thin film or thin films including an organic material or an inorganic material.

A first conductive layer L2 may be on the first insulating layer 13. The first conductive layer L2 may include the second scanning line SLn−1, the first scanning line SLn, the emission control line ELn, and the gate electrode G1 of the driving TFT T1.

The second scanning line SLn−1, the first scanning line SLn, and the emission control line ELn may extend in the first direction. The first direction may indicate, for example, a direction crossing the first sup-pixel SP1 and the second sub-pixel SP2. The second scanning line SLn−1 may function as the gate electrode G4 of the first initialization TFT T4 and the gate electrode G7 of the second initialization TFT T7. The first scanning line SLn may function as the gate electrode G2 of the data transmission TFT T2 and the gate electrode G3 of the compensation TFT 13. The emission control line ELn may function as the gate electrode G5 of the first emission control TFT T5 and the gate electrode G6 of the second emission control TFT T6.

The gate electrode G1 of the driving TFT T1 may function as the lower electrode Cst1 of the storage capacitor Cst. The gate electrode G1 of the driving TFT T1 may include a metallic material, for example, aluminum (Al), which has low resistance.

A second insulating layer 15 may be on the first insulating layer 13 to cover the gate electrode G1 of the driving TFT T1. The second insulating layer 15 may be a dielectric layer between the gate electrode G1 of the driving TFT T1 and the upper electrode Cst2 of the storage capacitor Cst. For example, the second insulating layer 15 may be a layer or layers including materials, e.g., a silicon oxide and/or a silicon nitride.

A second conductive layer L3 may be on the second insulating layer 15 and may include the data line DLm, the driving voltage lines PL, connection wires CW, a drain electrode DE4 of the first initialization TFT T4, and a drain electrode DE6 of the second emission control TFT T6. In one embodiment, the driving voltage lines PL and the connection wires CW may include the same material such as a metallic material.

The data line DLm may extend in the second direction and may transmit the data signal Dm to each of the first sup-pixel SP1 and the second sub-pixel SP2.

The driving voltage lines PL may respectively provide the driving voltage ELVDD to the first sup-pixel SP1 and the second sub-pixel SP2. The driving voltage lines PL may extend in the first direction and the second direction. The driving voltage lines PL extending in the first direction may overlap at least some portions of the driving TFTs T1 of the first sup-pixel SP1 and the second sub-pixel SP2. Thus, an area of a wire where a driving voltage is applied expands to an area of the driving voltage lines PL extending in the first direction, and a voltage drop caused by resistance of the wire may be alleviated.

The second direction may be a direction crossing the first direction. The driving voltage lines PL extending in the second direction may be symmetrical to each other with respect to the boundary between the first sup-pixel SP1 and the second sub-pixel SP2. The boundary between the first sup-pixel SP1 and the second sub-pixel SP2 may correspond, for example, to a middle portion of the driving voltage line PL, which provides the driving voltage to the first sub-pixel SP1 and extends in the second direction, and the driving voltage line PL which provides the driving voltage to the second sub-pixel SP2 and extends in the second direction.

The first sup-pixel SP1 and the second sub-pixel SP2 may share the driving voltage line PL extending in the first direction.

Referring to FIG. 3, the active pattern A1 of the driving TFT T1 of each of the first sup-pixel SP1 and the second sub-pixel SP2 is on the base substrate 11. The active pattern A1 of the driving TFT T1 of the first sub-pixel P1 may be symmetrical to the active pattern A1 of the driving TFT T1 of the second sub-pixel P2 with respect to the boundary between the first sup-pixel SP1 and the second sub-pixel SP2.

The gate electrode G1 of the driving TFT T1 corresponding to the channel area C1 may be on the first insulating layer 13 that covers the active patterns A1 of the driving TFTs T1.

The driving voltage line PL extending in the first direction may be on the second insulating layer 15 that covers the gate electrode G1 of the driving TFT T1. The driving voltage lines PL extending in the first direction may planarly overlap the gate electrode G1 of the driving TFT T1 of the first sub-pixel SP1 and the gate electrode G1 of the driving TFT T1 of the second sub-pixel SP2. The driving voltage line PL extending in the first direction may function as the upper electrode Cst2 of the storage capacitor Cst of the first sub-pixel SP1 and the upper electrode Cst2 of the storage capacitor Cst of the second sub-pixel SP2. The driving voltage lines PL extending in the first direction may be symmetrical with respect to the boundary between the first sup-pixel SP1 and the second sub-pixel SP2. Thus, the capacitance of the storage capacitor Cst of the first sub-pixel SP1 may be the same as the capacitance of the storage capacitor Cst of the second sub-pixel SP2.

Referring back to FIG. 2, the driving voltage line PL extending in the first direction may cover the drain area D1 of the driving TFT T1 of the first sub-pixel SP1 and the drain area D1 of the driving TFT T1 of the second sub-pixel SP2 overall. Accordingly, although an overlay deviation occurs between the semiconductor layer L1 and the second conductive layer L3, parasitic capacitance between the driving voltage line PL extending in the first direction and the drain area D1 of the driving TFT T1 of the first sub-pixel SP1 may be the same as the parasitic capacitance between the driving voltage line PL extending in the first direction and the drain area D1 of the driving TFT T1 of the second sub-pixel SP2.

An overlay deviation may correspond, for example, to a difference between an originally-designed overlapping area and a resultant overlapping area produced when each layer is planarly shifted in a vertical or horizontal direction while two or more layers are formed. The overlay deviation may occur due to misalignment of the substrate and a mask, and/or misalignment of the substrate and an exposure device, when a conductive layer is formed on an entire substrate and then patterned by photolithography and etching. The overlay deviation may occur within an error range of a device used in a system, for example, used to manufacture larger size panels and when large numbers of panels are simultaneously manufactured.

In an embodiment, the area of a portion where the driving voltage line PL extending in the first direction overlaps the gate electrode G1 of the driving TFT T1 of the first sub-pixel SP1 may be the same as the area of a portion where the driving voltage line PL extending in the first direction overlaps the gate electrode G1 of the driving TFT T1 of the second sub-pixel SP2. This may be so even though the driving voltage line PL is shifted vertically or horizontally from an original location. As a result, parasitic capacitance between the driving voltage line PL extending in the first direction and the drain area D1 of the driving TFT T1 of the first sub-pixel SP1 may be the same as the parasitic capacitance between the driving voltage line PL extending in the first direction and the drain area D1 of the driving TFT T1 of the second sub-pixel SP2. Thus, even when overlay deviation occurs, color deviation between the first sub-pixel SP1 and the second sub-pixel SP2 may be prevented. Also, a storage capacitor Cst may be designed with increased or maximum capacity. This may allow for the manufacture of an organic light-emitting display 1 with improved display quality.

The connection wire CW may electrically connect the gate electrode G1 of the driving TFT T1 to the drain area D3 of the compensation TFT T3 of each of the first sub-pixel SP1 and the second sub-pixel SP2.

Referring to FIG. 4, the active pattern A3 of the compensation TFT T3 of each of the first sub-pixel SP1 and the second sub-pixel SP2 is on the base substrate 11. In this case, the active pattern A3 of the compensation TFT T3 of the first sub-pixel SP1 may be asymmetrical relative to the active pattern A3 of the compensation TFT T3 of the second sub-pixel SP2, with respect to the boundary between the first sup-pixel SP1 and the second sub-pixel SP2.

The gate electrode G3 of the compensation TFT T3 that corresponds to the channel area C3 of the compensation TFT T3 may be on the first insulating layer 13 covering the active patterns A3 of the compensation TFTs T3.

The second insulating layer 15 that covers the gate electrodes G3 of the compensation TFTs T3 may include a first contact hole Cnt1 and a third contact hole Cnt3. Connection wires CW may be on the second insulating layer 15. The connection wires CW may include wires connecting the gate electrodes G1 of the driving TFTs T1 to the drain areas D3 of the active patterns A3 of the compensation TFTs T3 through the first contact hole Cnt1 and the third contact hole Cnt3. For example, the connection wires CW may electrically connect the gate electrodes G1 of the driving TFTs T1 to the drain areas D3 of the compensation TFTs T3 of the first sub-pixel SP1 and the second sub-pixel SP2. In this case, since the active pattern A3 of the compensation TFT T3 of the first sub-pixel SP1 is asymmetrical relative to the active pattern A3 of compensation TFT T3 of the second sub-pixel SP2, the connection wires CW of the first sup-pixel SP1 and the second sub-pixel SP2 may be asymmetrical relative to each other with respect to the boundary between the first sup-pixel SP1 and the second sub-pixel SP2.

Referring again to FIG. 2, the connection wire CW of the first sub-pixel SP1 and the connection wire CW of the second sub-pixel SP2 may be curved in the same shape. According to an embodiment, the connection wire CW of the first sup-pixel SP1 may be at the same distance as the connection wire CW of the second sub-pixel SP2 with respect to the first scanning line SLn functioning as the gate electrode G3 of the compensation TFT T3. As a result, even when overlay deviation occurs between the first conductive layer L2 and the second conductive layer L3, parasitic capacitance between the first scanning line SLn and the connection wire CW of the first sub-pixel SP1 may be the same as the parasitic capacitance between the first scanning line SLn and the connection wire CW of the second sub-pixel SP2. Thus, color deviation of the first sup-pixel SP1 and the second sub-pixel SP2 may be prevented, even when overlay deviation occurs. Thus, an organic light-emitting display 1 with improved display quality may be manufactured.

Referring to FIG. 5, the active patterns A4 of the first initialization TFTs T4 of the first sup-pixel SP1 and the second sub-pixel SP2 may be on the base substrate 11. The active pattern A4 of the first initialization TFT T4 of the first sub-pixel SP1 may be asymmetrical relative to the active pattern A4 of the first initialization TFT T4 of the second sub-pixel SP2 with respect to the boundary between the first sup-pixel SP1 and the second sub-pixel SP2. The source area S4 of the active pattern A4 of the first initialization TFT T4 of the first sub-pixel SP1 may be connected to the source area S4 of the active pattern A4 of the first initialization TFT T4 of the second sub-pixel SP2.

The gate electrode G4 of the first initialization TFT T4 that corresponds to the channel area C4 of the first initialization TFT T4 may be on the first insulating layer 13 covering the active pattern A4 of the first initialization TFT T4.

A fourth contact hole Cnt4 may be formed in the second insulating layer 15 covering the gate electrode G4 of the first initialization TFT T4. In an embodiment, the first sup-pixel SP1 and the second sub-pixel SP2 may share the fourth contact hole Cnt4. In this case, the fourth contact hole Cnt4 may be formed in an area where the first sub-pixel SP1 is disposed, except an area where the second sub-pixel SP2 is disposed.

The drain electrode DE4 of the first initialization TFT T4 that connects the source area S4 of the active pattern A4 of the first initialization TFT T4 to a second cover metal CM2 through the fourth contact hole Cnt4 may be on the second insulating layer 15. Since the fourth contact hole Cnt4 is formed only in the area where the first sub-pixel SP1 is disposed, the drain electrode DE4 of the first initialization TFT T4 may be asymmetrical with respect to the boundary between the first sup-pixel SP1 and the second sub-pixel SP2.

A third insulating layer 17 covering the drain electrode DE4 of the first initialization TFT T4 may include a first via hole VH1 and a second via hole VH2.

A third conductive layer L4 may be on the third insulating layer 17 and include a first cover metal CM1 and the second cover metal CM2. The first cover metal CM1 may connect the drain electrode DE6 of the second emission control TFT T6 to the pixel electrode of the OLED through the first via hole VH1. The second cover metal CM2 may connect the drain electrode DE4 of first initialization TFT T4 to the initialization voltage line VL through the second via hole VH2. Each of the first sup-pixel SP1 and the second sub-pixel SP2 may include the pixel electrode of the OLED. The first sup-pixel SP1 and second sub-pixel SP2 may share the second via hole VH2 and the initialization voltage line VL. Because the first sup-pixel SP1 and the second sub-pixel SP2 share the second via hole VH2, aperture ratio of pixels may be improved. In one embodiment, the pixel electrode of the OLED and the initialization voltage line VL may include a same material at the same level.

Referring again to FIG. 2, the second scanning line SLn−1 (that functions as the gate electrode G4 of the first initialization TFT T4 of the first sub-pixel SP1 and the gate electrode G4 of the first initialization TFT T4 of the second sub-pixel SP2) may be symmetrical with respect to the boundary between the first sup-pixel SP1 and the second sub-pixel SP2. The active pattern A4 of the first initialization TFT T4 of the first sub-pixel SP1 may be asymmetrical relative to the active pattern A4 of the first initialization TFT T4 of the second sub-pixel SP2 with respect to the boundary between the first sup-pixel SP1 and the second sub-pixel SP2.

In accordance with one or more of the aforementioned embodiments, elements in one pixel may be arranged symmetrically to corresponding elements of one or more adjacent pixels. As a result, an organic light-emitting display may be manufactured to have compact size and high resolution.

Also, in accordance with one or more of the aforementioned embodiments, the widths of wires shared by adjacent pixels may correspond to widths of respective elements of one or more adjacent pixels. As a result, a difference in parasitic capacitance of each of the adjacent pixels due to overlay deviation may be reduced or prevented.

Also, in accordance with one or more of the aforementioned embodiments, some elements in one pixel are arranged asymmetrically relative to corresponding elements of one or more adjacent pixels. As a result, a difference in parasitic capacitance of the adjacent pixels due to overlay deviation may be reduced or prevented. An organic light-emitting display may therefore be made to have reduced color deviation per pixel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display, comprising:
a first pixel including a first capacitor having a first lower electrode;
a second pixel, adjacent to the first pixel, the second pixel including a second capacitor having a second lower electrode; and
a driving voltage line to apply a driving voltage to the first pixel and the second pixel, wherein the first pixel includes a first driving transistor and a first compensation transistor and the second pixel includes a second driving transistor and a second compensation transistor wherein: an active pattern of the first driving transistor and an active pattern of the second driving transistor are symmetrical to each other with respect to a boundary between the first pixel and the second pixel; and
an active pattern of the first compensation transistor and an active pattern of the second compensation transistor are asymmetrical to each other with respect to the boundary,
wherein one end of the active pattern of the first compensation transistor is connected to a first driving transistor gate and another end of the active pattern of the first compensation transistor is connected to the active pattern of the first driving transistor,
wherein one end of the active pattern of the second compensation transistor is connected to a second driving transistor gate and the another end of the active pattern of the second compensation transistor is connected to the active pattern of the second driving transistor,
wherein the driving voltage line includes a first portion extending in a first direction crossing the boundary between the first pixel and the second pixel, a second portion extending in a second direction crossing the first direction in the first pixel, and a third portion extending in the second direction in the second pixel, the first portion contained within the first pixel and the second pixel and extending continuously to overlap the first lower electrode and the second lower electrode, and
wherein the first portion of the driving voltage lines that extend in the first direction planarly overlaps the first driving transistor gate and the second driving transistor gate.

2. The display as claimed in claim 1, wherein the boundary corresponds to a middle portion of the first pixel and the second pixel.

3. The display as claimed in claim 1, wherein each of the first compensation transistor and the second compensation transistor includes a first compensation active pattern and a second compensation active pattern that are asymmetrical to each other with respect to the boundary.

4. The display as claimed in claim 1, wherein:
the first pixel is a red or blue sub-pixel, and
the second pixel is a green sub-pixel.

5. The display as claimed in claim 1, wherein the first portion of the driving voltage line serves as a first upper electrode of the first capacitor and a second upper electrode of the second capacitor.

6. The display as claimed in claim 1, wherein the first portion of the driving voltage line planarly overlaps a first driving gate electrode of the first driving transistor and a second driving gate electrode of the second driving transistor.

7. The display as claimed in claim 6, wherein the first portion of the driving voltage line includes:
- a first upper electrode of a first storage capacitor of the first pixel, and
- a second upper electrode of a second storage capacitor of the second pixel.

8. The display as claimed in claim 6, wherein the first portion of the driving voltage line is symmetrical with respect to the boundary.

9. The display as claimed in claim 1, wherein each of the first driving transistor and the second driving transistor includes a first driving active pattern and a second driving active pattern that are symmetrical to each other with respect to the boundary.

10. The display as claimed in claim 9, wherein the first portion of the driving voltage line overlaps a first driving drain area of the first driving active pattern and a second driving drain area of the second driving active pattern.

11. The display as claimed in claim 1, wherein:
- each of the first pixel and the second pixel includes a first connection wire and a second connection wire,
- the first connection wire is to electrically connect the first driving transistor to the first compensation transistor,
- the second connection wire is to electrically connect the second driving transistor to the second compensation transistor, and
- the first connection wire is asymmetrical to the second connection wire with respect to the boundary.

12. The display as claimed in claim 11, wherein:
- the first connection wire is to electrically connect a first driving gate electrode of the first driving transistor to a first compensation drain area of the first compensation transistor, and
- the second connection wire is to electrically connect a second driving gate electrode of the second driving transistor to a second compensation drain area of the second compensation transistor.

13. The display as claimed in claim 11, wherein the first connection wire and the second connection wire include a same material and are at a same level as the driving voltage line.

14. The display as claimed in claim 11, wherein each of the first connection wire and the second connection wire includes a metallic material.

15. The display as claimed in claim 11, wherein the first connection wire and the second connection wire are curved in a same shape.

16. The display as claimed in claim 11, further comprising:
- a first scanning line to provide scanning signals to the first compensation transistor and the second compensation transistor, wherein the first connection wire is at a same distance as the second connection wire with respect to the first scanning line.

17. The display as claimed in claim 1, wherein each of the first pixel and the second pixel includes a first initialization transistor and a second initialization transistor that are asymmetrical to each other with respect to the boundary.

18. The display as claimed in claim 17, further comprising:
- a plurality of scanning lines to provide scanning signals to the first initialization transistor and the second initialization transistor and extending in the first direction.

19. The display as claimed in claim 18, wherein the scanning lines are symmetrical to each other with respect to the boundary.

* * * * *